US012614693B2

(12) United States Patent　　　(10) Patent No.: US 12,614,693 B2
Kiss et al.　　　　　　　　　　　(45) Date of Patent:　Apr. 28, 2026

(54) AUTOMATIC ELECTRON BEAM CALIBRATION ON PERIODIC NANOSTRUCTURES

(71) Applicant: Snap Inc., Santa Monica, CA (US)

(72) Inventors: Marcell Kiss, Didcot (GB); Jamie Dean Reynolds, Southampton (GB)

(73) Assignee: Snap Inc., Santa Monica, CA (US)

( * ) Notice: Subject to any disclaimer, the term of this patent is extended or adjusted under 35 U.S.C. 154(b) by 167 days.

(21) Appl. No.: 18/664,673

(22) Filed: May 15, 2024

(65) Prior Publication Data

US 2025/0357075 A1　Nov. 20, 2025

(51) Int. Cl.
　G03F 7/20　　　(2006.01)
　G06T 3/40　　　(2006.01)
　G06T 5/10　　　(2006.01)
　G06T 7/80　　　(2017.01)
　　　　(Continued)

(52) U.S. Cl.
　CPC .............. H01J 37/222 (2013.01); G06T 3/40 (2013.01); G06T 5/10 (2013.01); G06T 7/80 (2017.01); G06T 2207/10061 (2013.01); G06T 2207/20056 (2013.01); G06T 2207/30168 (2013.01); H01J 37/28 (2013.01); H01J 2237/2826 (2013.01)

(58) Field of Classification Search
　CPC .. H01J 37/222; H01J 37/28; H01J 2237/2826; H01J 2237/216; H01J 2237/223; H01J 2237/2487; G06T 3/40; G06T 5/10; G06T 7/80; G06T 2207/10061; G06T 2207/20056; G06T 2207/30168
　See application file for complete search history.

(56) References Cited

U.S. PATENT DOCUMENTS 7,408,154 B2　8/2008　Oosaki et al.
9,627,175 B2　4/2017　Morita et al.
10,446,365 B2　10/2019　Kaneko
　　　　(Continued)

FOREIGN PATENT DOCUMENTS

JP　　2008112684　　5/2008

OTHER PUBLICATIONS

"International Application Serial No. PCT US2025 029067, International Search Report mailed Sep. 30, 2025", 3 pgs.
　　　　(Continued)

*Primary Examiner* — Howard D Brown, Jr.
(74) *Attorney, Agent, or Firm* — Schwegman Lundberg & Woessner, P.A.

(57) ABSTRACT

Systems, methods, and media for calibrating a scanning electron microscope (SEM). The system includes a processor and a memory. The memory stores instructions that, when executed by the processor, configure the system to perform operations. An electron microscope image of a periodic structure is generated by the SEM. A Fourier transform of the electron microscope image is computed to generate a spectrum. Reciprocal lattice vectors are computed based on a known periodicity of the periodic structure. A pixel mask is generated based on the reciprocal lattice vectors and applied to filter the spectrum. A quality metric is generated based on an aggregate magnitude of the filtered spectrum and a magnitude of a zero-frequency component of the filtered spectrum. A pixel scaling parameter, focus parameter, and/or stigmation parameter of the SEM are determined based on the quality metric.

20 Claims, 4 Drawing Sheets

(51) Int. Cl.
    *H01J 37/22*     (2006.01)
    *H01J 37/28*     (2006.01)

(56)         References Cited

U.S. PATENT DOCUMENTS

| | | | | |
|---|---|---|---|---|
| 11,435,671 | B2 | 9/2022 | Kooiman | |
| 12,040,152 | B2 * | 7/2024 | Kaminer | H05G 2/00 |
| 2008/0067380 | A1 | 3/2008 | Ozawa et al. | |
| 2010/0223697 | A1 * | 9/2010 | Moeck | G01Q 40/00 |
| | | | | 382/307 |
| 2012/0025073 | A1 * | 2/2012 | Kumar | G01N 23/203 |
| | | | | 250/307 |
| 2022/0277427 | A1 | 9/2022 | Bromberg et al. | |
| 2025/0111636 | A1 * | 4/2025 | Vuong | G06V 10/82 |
| 2025/0357075 | A1 * | 11/2025 | Kiss | G06T 7/80 |

OTHER PUBLICATIONS

"International Application Serial No. PCT US2025 029067, Written Opinion mailed Sep. 30, 2025", 8 pgs.

* cited by examiner

200

202

OBTAIN ELECTRON MICROSCOPE IMAGE OF PERIODIC STRUCTURE

204

COMPUTE FOURIER TRANSFORM OF ELECTRON MICROSCOPE IMAGE

206

COMPUTE RECIPROCAL LATTICE VECTORS

208

GENERATE PIXEL MASK

210

GENERATE FILTERED SPECTRUM BY APPLYING PIXEL MASK

212

COMPUTE QUALITY METRIC

214

DETERMINE OPERATING PARAMETER BASED ON QUALITY METRIC

AUTOMATIC ELECTRON BEAM CALIBRATION ON PERIODIC NANOSTRUCTURES

TECHNICAL FIELD

The present disclosure relates generally to electron beam microscopy and, more particularly, to automatic calibration of an electron beam microscope for imaging a pattern of periodic nanostructures.

BACKGROUND

Scanning electron microscopes (SEMs) are tools that allow for the visualization of surface topographies and compositions with high resolution. They operate by scanning a focused beam of electrons across a sample and detecting the secondary or backscattered electrons that are emitted from the sample's surface.

BRIEF DESCRIPTION OF THE SEVERAL VIEWS OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some non-limiting examples are illustrated in the figures of the accompanying drawings in which.

DETAILED DESCRIPTION

Figure 1:
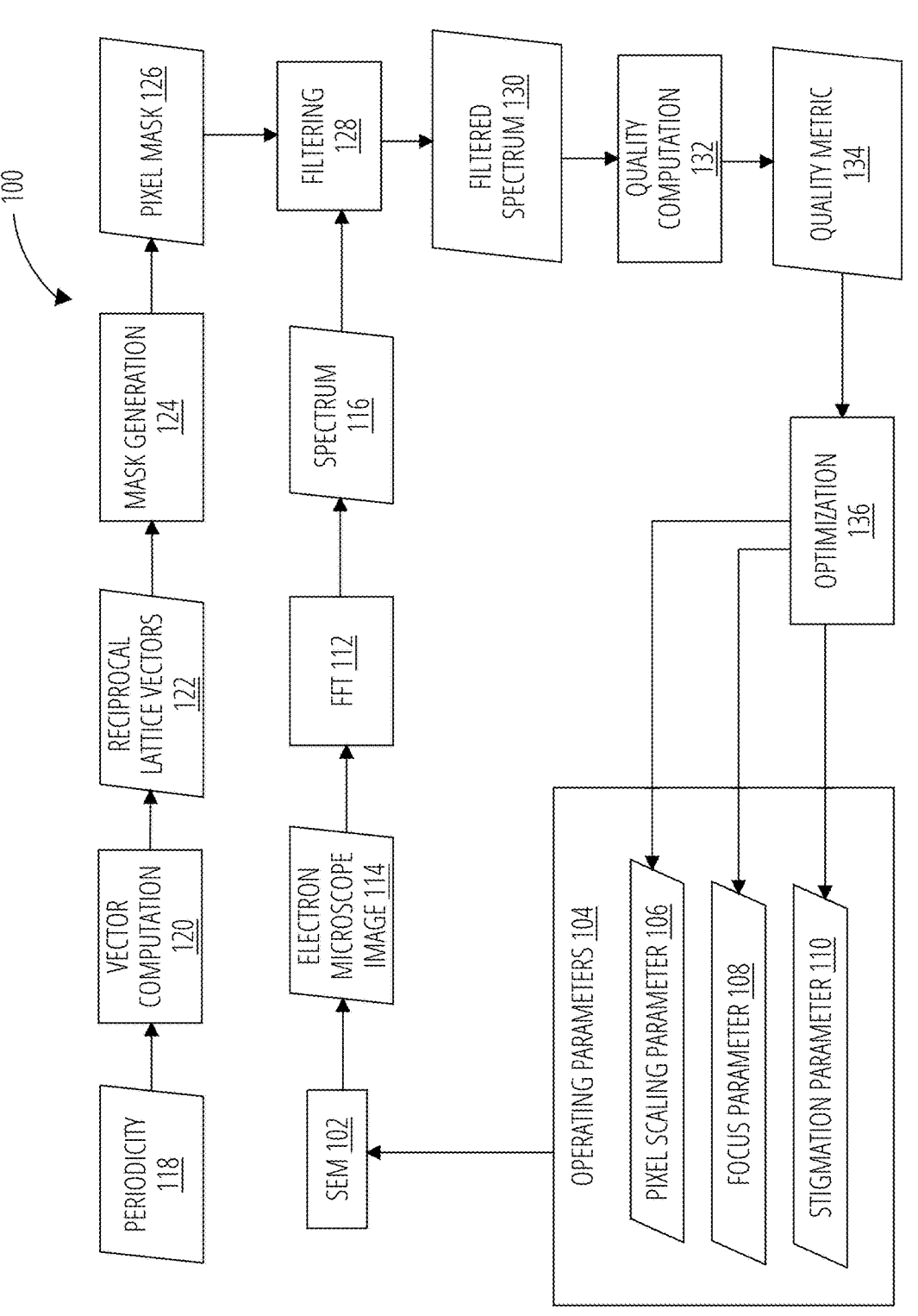
FIG. 1 illustrates a block diagram of a system configured to calibrate a SEM, in accordance with some examples.

Examples described herein may provide systems, methods, and computer-readable media for the automatic calibration of the electron beam of a SEM for imaging a periodic structure having a pattern of nanostructures repeated periodically over its surface. When imaging a periodic structure having a known periodicity, the periodicity can be leveraged to enhance the calibration and focusing process.

One of the challenges in SEM imaging is the need for precise calibration and focusing to ensure accurate representation of the sample's features. Traditional methods of calibration and focusing can be time-consuming and may not provide the level of accuracy required for certain applications, such as the measurement of nanostructures.

Calibration of a SEM typically involves using a known reference sample, such as a reference object of a known length, to adjust the magnification or pixel size of the SEM. However, the precision of typical reference samples is fairly low in the context of nanoscale structures: a fixed-length reference sample may only be precise to within a relatively large margin of error, such as 20 nanometers. Focusing and stigmatization, which ensure that the electron beam forms the smallest possible spot on the sample and is symmetrical, are usually performed manually by the operator. However, manual adjustments can be subjective and may not be optimal for all imaging conditions, especially when dealing with noisy images or patterns that lack clear edges.

Frequency domain representations of SEM images can be used to automate the scaling, focusing, and stigmation processes with respect to the imaging of periodic structures. By using a Fourier transform (e.g., a fast Fourier transform (FFT)) of an electron microscope image, the analysis of periodic structures in the image may be less affected by noise, and may depend less on the presence of clear edges of structures visible in the image. The Fourier-transformed image can be used to derive a quality metric, which is then used to determine the optimal operating parameters of the SEM, including pixel scaling, focus, and/or stigmation. In some examples, a known periodic structure can be used as a reference sample, which can be optically interrogated to ensure traceability to external standards; this may further enhance the accuracy of the calibration process by allowing a single pixel scaling calibration routine to be performed once before imaging a batch of test samples. In some examples, focus and stigmation calibration can be performed for each test sample, or for each imaging session performed on each test sample.

Some examples described herein may address one or more technical problems in the field of electron beam calibration for SEMs. Automatic calibration of pixel scaling, focus, and/or stigmation can improve the efficiency and/or accuracy of SEM imaging, particularly for periodic nanometer-scale structures such as diffractive structures on the surface of a waveguide. Additionally, the ability to automate the focusing and stigmatization process can save time and reduce the potential for human error, leading to more consistent and reliable imaging results.

FIG. 1 shows a block diagram of a SEM calibration system 100 configured to perform automatic calibration of a SEM. A skilled artisan will readily recognize that various additional functional components may be supported by the SEM calibration system 100 to facilitate additional functionality that is not specifically described herein. The various functional components depicted in FIG. 1 may reside on a single computing device or may be distributed across several computing devices in various arrangements such as those used in cloud-based architectures.

An example machine 300 is described below with reference to FIG. 3 which may provide an architecture for the SEM calibration system 100 in some examples. In some examples, the SEM calibration system 100 may use a software architecture as described with reference to FIG. 4 below. Each of the various modules, logic blocks, and operations shown as components of the SEM calibration system 100 can be implemented variously as hardware components, software components, and/or a mixture of hardware and software components of the SEM calibration system 100.

The SEM calibration system 100 includes a scanning electron microscope, shown as SEM 102, which operates according to a set of operating parameters 104. The operating parameters 104 can include at least one pixel scaling parameter 106 used to control the pixel scaling or pixel size (also referred to as magnification) of the images generated by the SEM 102, at least one focus parameter 108 used to control the focus of the electron beam of the SEM 102 (e.g., a single parameter referred to as a focus parameter or a working distance parameter), and at least one stigmation parameter 110 used to control the stigmation or shape of the electron beam of the SEM 102 as it reflects from the object being imaged (e.g., a single parameter referred to as a stigmation parameter). The at least one focus parameter 108 can include a parameter that controls the distance between the final lens of the SEM 102 and the surface of the sample (e.g., by physically moving the sample) and/or a parameter that controls the focus of the electron beam optics via electromagnetic lenses. Some examples described herein may calibrate focus by adjusting only a parameter focusing the electron beam optics via the electromagnetic lenses, as this may be a finer and more precise adjustment of focus than mechanically moving the sample.

Additional operating parameters 104 may also be used to control the SEM 102, such as an accelerating voltage parameter used to control the voltage applied to accelerate the electrons towards the sample, a beam current parameter used to control the amount of current in the electron beam, an aperture size parameter used to control the size of the apertures of the SEM used to control the beam current and convergence angle, a lens current parameter used to control electromagnetic lenses that focus the electron beam, a stigmator parameter used to control the stigmators (electromagnetic coils of the SEM that perform stigmation by correcting the asymmetry of the electron beam), an astigmatism correction parameter used to adjust the stigmators to correct for astigmatism in the electron beam, a Z-height or stage height parameter used to control the vertical position of the sample stage to bring the sample into the correct focal plane, a focus control parameter used to control automatic or semi-automatic focus control systems that can adjust the lens currents to achieve optimal focus, and/or a scan coil parameter used to control the movement of the electron beam across the sample using scan coils. Typically, when one or more of these (or other) operating parameters 104 are changed, the SEM 102 must be re-calibrated, at least with respect to focus and stigmation.

The SEM 102, operating in accordance with the operating parameters 104, generates an electron microscope image 114 of an object being imaged. In examples described herein, the object may be a periodic structure, such as a diffraction grating on a waveguide surface having a known periodicity 118. In some examples, a reference sample of the periodic structure may be imaged by the SEM 102 to generate the electron microscope image 114, wherein the reference sample has a known periodicity 118 which is provided to the SEM calibration system 100 as an input. In some examples, the periodicity 118 of the reference sample can be determined or validated by independent testing using a sensing modality other than electron microscopy: for example, a periodic optical structure of a diffraction grating or other repeating optical structure of a waveguide can be validated through optical testing, such as by testing the outcoupling and/or incoupling of light via various regions of the waveguide surface.

Periodic structures include patterns of structures or features that repeat at regular intervals or periods. A periodic structure can include patterns of features that repeat periodically in one dimension (sometimes referred to as one-dimensional or 1D lattices or gratings), and/or patterns of features that repeat periodically in two dimensions (sometimes referred to as two-dimensional or 2D lattices or gratings), over the surface of the object. In some cases, a surface of the object can include different patterns of repeating features in different regions of the surface; in such cases, the different regions can each be considered to manifest a distinct periodic structure.

After the SEM 102 captures or generates the electron microscope image 114, a Fourier transform is performed on the electron microscope image 114 (e.g., a fast Fourier transform operation performed by a module shown as FFT 112) to generate a frequency-domain representation of the electron microscope image 114, shown as spectrum 116.

In some examples, a windowing function (not shown) can be applied to the electron microscope image 114 by the SEM calibration system 100. The windowing function is configured to mitigate edge effects when generating the spectrum 116. When a finite image is transformed from the time or spatial domain to the frequency domain using a Fourier transform, the assumption is that the signal or image repeats infinitely. However, in practice, the image is finite, and this assumption can lead to artificial discontinuities at the edges where the end of the image does not smoothly transition to the beginning. These discontinuities can introduce artifacts in the Fourier transform, known as spectral leakage, where energy from the true frequencies "leaks" into other frequencies, leading to a less accurate representation of the image in the frequency domain.

To address this issue, a windowing function can be applied to the electron microscope image 114 before performing the FFT 112. The windowing function gradually reduces the amplitude of the electron microscope image 114 towards its edges, effectively smoothing out the discontinuities and minimizing spectral leakage. Common windowing functions include the Hamming, Hanning, Blackman, and Kaiser windows, among others. Each window has different characteristics and can be chosen based on the specific requirements of the analysis.

A vector computation 120 module of the SEM calibration system 100 computes a set of one or more reciprocal lattice vectors 122 based on the known periodicity 118 of the periodic structure being imaged. For example, a reference sample of a diffraction grating imprinted on a waveguide surface may have a period or pitch of 620 nanometers (nm). This means that a feature of the diffraction grating repeats every 620 nm when traveling in a specific direction over the waveguide surface. This known periodicity 118 can be used to generate a reciprocal lattice vector characterizing the periodicity 118 of the periodic structure.

A reciprocal lattice vector is a concept from crystallography and solid-state physics that is used to describe the periodicity of a crystal lattice in the frequency or reciprocal space. The reciprocal lattice is a mathematical construct that is used to simplify the analysis of periodic structures, such as crystals, and their interaction with waves, such as X-rays, electrons, or neutrons.

In the context of a periodic structure, like a crystal, the lattice is defined by a set of basis vectors in real space that describe the repeating pattern of the structure. The reciprocal lattice is defined in a similar way, but in reciprocal space (also known as momentum space or k-space), with its own set of basis vectors known as reciprocal lattice vectors.

The reciprocal lattice vectors are particularly useful in the analysis of diffraction patterns, as they are directly related to the directions and intensities of the diffracted beams. The relationship between the real lattice and the reciprocal lattice is such that the reciprocal lattice vectors are perpendicular to the planes of the real lattice and their lengths are inversely proportional to the spacings between these planes.

Mathematically, if the real-space lattice of the periodic structure is defined by basis vectors a, b, and c, the reciprocal lattice vectors b1, b2, and b3 can be calculated using the following cross-product relations:

$$b1 = (b \times c)/(a \cdot (b \times c))$$
$$b2 = (c \times a)/(b \cdot (c \times a))$$
$$b3 = (a \times b)/(c \cdot (a \times b))$$

These vectors define the geometry of the reciprocal lattice, which is used to predict the diffraction pattern of the crystal.

In a one-dimensional (1D) lattice with a periodicity 118 of 'a' (where 'a' is the distance between repeating features in the lattice), the reciprocal lattice is also one-dimensional. The reciprocal lattice vector 'b' for a 1D lattice is defined as:

$$b = 1/a$$

This vector 'b' is the fundamental vector that defines the reciprocal lattice in one dimension. It is oriented in the same direction as the real lattice and has a magnitude that is inversely proportional to the spacing of the real lattice.

In a two-dimensional (2D) lattice, the lattice is defined by two non-collinear basis vectors in real space, which can be denoted as 'a1' and 'a2'. The reciprocal lattice vectors 'b1' and 'b2' for a 2D lattice are defined using the cross-product to ensure they are perpendicular to the real-space lattice planes. They are given by:

$$b1 = (1/(a1 \times a2)) \cdot a2$$
$$b2 = (1/(a1 \times a2)) \cdot a1$$

Here, 'a1×a2' represents the cross-product of the real-space basis vectors, which gives the area of the unit cell in real space. The reciprocal lattice vectors 'b1' and 'b2' are perpendicular to 'a2' and 'a1', respectively, and their magnitudes are inversely proportional to the respective spacings in real space.

In the SEM calibration system 100, the reciprocal lattice vectors 122 of the periodic structure are used by a mask generation 124 module to construct a pixel mask 126. The pixel mask 126 is configured to isolate the specific features of the spectrum 116 that correspond to the periodicity 118 of the lattice of the periodic structure.

A filtering 128 module tiles the pixel mask 126 across the spectrum 116 using the reciprocal lattice vectors 122, allowing only the frequencies that match the reciprocal lattice points to remain in the resulting filtered spectrum 130. The filtered spectrum 130 includes only the relevant frequency components of the spectrum 116: those that represent the periodic structure. The remaining components of the spectrum 116 are set to zero, effectively removing noise and other non-periodic information from the frequency-domain representation of the image. The filtered spectrum 130 is then used by a quality computation 132 to compute a quality metric 134, which serves as a basis for adjusting or calibrating the operating parameters 104 of the SEM 102, at the optimization 136 module, to achieve optimal imaging conditions.

To determine a calibrated value (e.g., an optimal or desirable value) for the pixel scaling parameter 106, the SEM calibration system 100 can vary the pixel scaling parameter 106 of the electron microscope image 114 and observe how these changes affect the quality metric 134. The goal is to find a value of the pixel scaling parameter 106 that maximizes the quality metric 134, indicating that the periodic features in the image are most accurately represented. Determining the calibrated value of the pixel scaling parameter 106 can typically be accomplished without performing multiple imaging passes over the object being imaged: instead, the pixel scale or pixel size of the electron microscope image 114 can be adjusted in software, and the computation of the quality metric 134 can be performed iteratively to generate multiple values for the quality metric 134 corresponding to multiple possible values for the pixel scaling parameter 106. The multiple values of the quality metric 134 can then be analyzed to identify, select, or determine a calibrated value for the pixel scaling parameter 106.

In some examples, the pixel scaling parameter 106 can be calibrated by an optimization 136 module by iteratively repeating a sequence of operations to generate the multiple values for the quality metric 134 corresponding to multiple possible values for the pixel scaling parameter 106. The operations include varying the pixel scaling parameter 106, applying the pixel scaling parameter 106 to the electron microscope image 114 to generate a re-scaled electron microscope image, re-computing the Fourier transform of the re-scaled electron microscope image to generate a re-scaled spectrum, re-generating the filtered spectrum by applying the pixel mask 126 (which is the same in each iteration) to the re-scaled spectrum to generate a re-scaled filtered spectrum, and re-computing the quality metric 134 based on the re-scaled filtered spectrum. The calibrated value for the pixel scaling parameter 106 is then determined based on the computed and re-computed values of the quality metric 134, e.g., by selecting a value of the pixel scaling parameter 106 that corresponds to the greatest computed value of the quality metric 134 among the multiple values, or a value of the pixel scaling parameter 106 that corresponds to a greatest predicted value of the quality metric 134 based on the multiple values. For example, the calibrated value of the pixel scaling parameter 106 can be determined, based on the multiple values of the quality metric 134, by fitting a Gaussian curve to the multiple values of the quality metric 134 relative to the pixel scaling parameter 106, and determining the calibrated value for the pixel scaling parameter 106 based on an optimum (e.g., highest) value of the quality metric 134 on the Gaussian curve.

Once the calibrated value for the pixel scaling parameter 106 is determined—e.g., corresponding to a maximum value for the quality metric—the SEM 102 can be considered to be calibrated with regard to pixel scaling. This calibrated value for the pixel scaling parameter 106 ensures that any electron microscope images 114 captured by the SEM 102 using the calibrated value of the pixel scaling parameter 106 have the correct magnification and that the dimensions measured in the electron microscope images 114 accurately reflect the true dimensions of the periodic structure.

In some examples, the pixel scaling parameter 106 can be calibrated using a reference sample of the periodic structure. The reference sample may be a sample of the periodic structure that has already been validated with respect to its periodicity 118, as described above. After the pixel scaling parameter 106 is calibrated, one or more test samples of the periodic structure can be imaged. In some cases, imaging multiple test samples involves moving one or more components of the SEM 102 and/or the object being imaged (such as a plate holding the test sample), thereby requiring calibration of the one or more focus parameters 108 and/or stigmation parameters 110 based on the new position of the components. Thus, calibration of the one or more focus parameters 108 and/or stigmation parameters 110 can be performed for each test sample, or for each imaging session performed on each test sample. In some examples, the pixel scaling parameter 106 may be periodically re-calibrated during a sequence of imaging sessions to prevent drift from the initial calibration. However, the one or more focus parameters 108 and/or stigmation parameters 110 typically require more frequent re-calibration. Thus, in some examples, the one or more focus parameters 108 and/or stigmation parameters 110 can be re-calibrated after each M images, M being a positive integer greater than one, and the pixel scaling parameter 106 can be re-calibrated after each N images, N being a positive integer greater than M.

In some examples, calibrating the one or more focus parameters 108 and/or stigmation parameters 110 involves iteratively repeating the imaging, Fourier transform, filtering, and quality metric computation operations of the SEM calibration system 100 multiple times, while varying the one or more focus parameters 108 and/or stigmation parameters 110 between each iteration, to generate multiple values for the quality metric 134 corresponding to multiple values of the one or more focus parameters 108 and/or stigmation parameters 110. After multiple values of the quality metric 134 have been computed corresponding to multiple values of the one or more focus parameters 108 and/or stigmation parameters 110, the selection or determination of calibrated values for the one or more focus parameters 108 and/or stigmation parameters 110 can be performed using any suitable optimization techniques for one parameter or for multiple parameters. For example, as in the case of calibrating the pixel scaling parameter 106, a Gaussian curve can be fitted to multiple values of the quality metric 134 relative to multiple values of one of the focus parameters 108 or one of the stigmation parameters 110. This parameter can then be optimized by selecting the optimal (e.g., greatest) value of the quality metric 134 on the Gaussian curve, and selecting the parameter value corresponding to the selected value of the quality metric 134. Multiple parameters can be thereby optimized by varying each parameter across multiple iterations while holding other parameter values constant. In some examples, the scanning operations performed during optimization are performed at a lower resolution and a faster speed than the scanning operations performed to generate the final image. For example, in some cases, the scanning operations used to generate the quality data points for optimization may image the area of interest at a rate of multiple times per second, whereas the final image of the area of interest is scanned over a period of multiple minutes. The scans used for optimization can be relatively rapid and low-resolution while still providing sufficient information to generate a reliable and meaningful value for the quality metric 134.

Computation of the quality metric 134 by the quality computation 132 module can involve various operations. In some examples, the quality computation 132 module performs a normalization operation to generate a normalized version of the filtered spectrum 130, referred to herein as a normalized spectrum. The filtered spectrum 130 is normalized to ensure that the magnitude of its components is scaled relative to a reference value, typically the zero-frequency component of the filtered spectrum 130, also known as the DC component. Normalization assists in processing the spectrum 116, as it allows for the comparison of different spectra on a common scale and helps to mitigate variations due to factors such as intensity fluctuations or variations in signal strength.

In some examples, the quality computation 132 module performs normalization in several steps. The quality computation 132 module identifies the zero-frequency component of the filtered spectrum 130, which is located at the center or zero-frequency point of the spectrum. The zero-component represents the average or background signal of the image (after filtering by the pixel mask 126). The magnitude of each component of the filtered spectrum 130 is then divided by the magnitude of the zero-frequency component. Normalization scales the entire filtered spectrum 130 so that the zero-frequency component has a magnitude of one, effectively normalizing the filtered spectrum 130 with respect to the average signal. The result of the normalization operation is a normalized spectrum where the relative magnitudes of the spectral components are preserved, but the absolute values are adjusted to account for the reference value set by the zero-frequency component. It will be appreciated that, in some cases, normalization can be performed at an earlier or later stage on earlier or later versions of the electron microscope image 114 or spectrum 116 with similar end results.

Normalization can be important for subsequent analysis, such as computing the quality metric 134, because it allows for a consistent assessment of the spectral components' magnitudes, independent of the overall signal intensity.

In some examples, the quality computation 132 may perform an inverse Fourier transform operation on some version of the spectrum 116 (e.g., the filtered spectrum 130 or the normalized spectrum) to generate an inverse spectrum (e.g., a filtered and/or normalized spatial-domain image). This inverse spectrum can then be used to compute the quality metric 134. In some examples, the absolute values of one or more components of the inverse spectrum can be summed to compute the quality metric 134. In some examples, the inverse spectrum can be normalized (if it is generated based on a non-normalized version of the filtered spectrum 130). It will be appreciated that the normalization, filtering, and inverse Fourier transform operations can be performed in various orders in various examples, as long as the filtering is performed on a frequency-domain spectrum instead of a time-domain image.

The SEM calibration system 100 may thereby enhance the clarity and precision of subsequent electron microscope images 114 by ensuring that the focus is on the intrinsic periodic features of the sample.

A code sample is provided below that provides an example algorithm for performing some of the operations of the SEM calibration system 100:

```
def calculate_lattice_mask(pixel_size, Dx, Dy):
    Dx = Dx / pixel_size
    Dy = Dy / pixel_size
    a1 = np.array((Dy/2, Dx/2))
    a2 = np.array((Dy/2, -Dx/2))
    a1r = np.array((a1[1], -a1[0]))
    a2r = np.array((a2[1], -a2[0]))
    b1 = a2r/np.dot(a2r, a1) * 1024
    b2 = a1r/np.dot(a1r, a2) * 1024
    X, Y = np.mgrid[-5:6, -5:6]
    b1s = np.transpose(np.array((X.flatten( ), X.flatten( )))) *
b1
    b2s = np.transpose(np.array((Y.flatten( ), Y.flatten( )))) *
b2
    vecs = b1s + b2s + 1024/2
    idxs = np.round(vecs).astype(np.int32)
```

-continued

```
    return idxs
def filtered_image_spectrum(image, mask):
    padded = np.pad(image, ((0, 1024-image.shape[0]), (0,
1024-image.shape[1])), 'constant', constant_values=0)
    spectrum = np.fft.fftshift(np.fft.fft2(padded))
    filtered = np.zeros_like(spectrum)
    for i in mask:
        if(i[1] < 1024 and i[1] > 0 and i[0] < 1024 and i[0] >
0):
            filtered[i[1], i[0]] = spectrum[i[1], i[0]]
        if(np.abs(filtered[512, 512]) > 0):
            filtered = filtered *
np.reciprocal(np.abs(filtered[512, 512])) # normalization to
DC component
        else:
            filtered = filtered * 0
    return filtered
def image_quality(image, pixel_size, Dx, Dy):
    mask = calculate_lattice_mask(pixel_size, Dx, Dy)
    spectrum = filtered_image_spectrum(image, mask)
    isp = np.fft.ifftshift(spectrum)
    quality = np.sum(np.abs(isp))
    return quality
```

The code sample includes three defined functions: calculate_lattice_mask, filtered_image_spectrum, and image_quality. The image_quality function invokes the other two functions, and can be considered to be a single iteration of the operations of the FFT 112, vector computation 120, mask generation 124, filtering 128, and quality computation 132 modules.

In the code sample, the magnitude of the spectrum 116 is summed as part of the image_quality function. The process involves the following steps:

First, a pixel mask 126 is calculated using the calculate_lattice_mask function, which is based on the pixel size and the known dimensions (Dx, Dy) of the periodic structure being imaged.

Second, the filtered_image_spectrum function is used to apply the pixel mask 126 to the Fourier-transformed electron microscope image 114 (the spectrum 116). The filtered_image_spectrum function creates a filtered version of the spectrum (filtered spectrum 130) where only the components that correspond to the pixel mask 126 are retained.

The filtered spectrum 130 is normalized to the DC or zero-frequency component (if the magnitude of the zero-frequency component is non-zero) to ensure that the quality metric 134 is not skewed by the overall intensity of the electron microscope image 114 (or, more specifically, of the filtered spectrum 130).

The image_quality function then computes the inverse Fourier transform of the filtered spectrum to obtain the inverse spectrum ("isp").

The quality metric 134 is calculated by summing the absolute values of the inverse spectrum. This is done using the np.sum(np.abs(isp)) operation, which adds up the magnitudes of all the elements in the inverse spectrum array.

The sum of the magnitudes of the filtered spectrum 130, referred to as "quality" in the code, is used as the quality metric 134 to determine the calibrated values for the operating parameters 104 of the SEM 102.

In some examples, software implementing the operations of the SEM calibration system 100 can be provided for use in conjunction with an existing SEM capable of being configured through software, such as through an application programming interface (API) provided by the manufacturer of the SEM. A reference sample can also be provided along with the software in some cases, for example, as part of a kit including the software (which may be stored on a computer-readable storage medium) and the reference sample. In some examples, the reference sample can be a durable object, such as an etched hard master of a periodic nanostructure. The hard master can be used to fabricate working stamps for imprinting copies of the hard master into a resin or other deformable material to fabricate additional samples of the periodic structure. These fabricated samples can be imaged as test samples, as described above.

Figure 2:
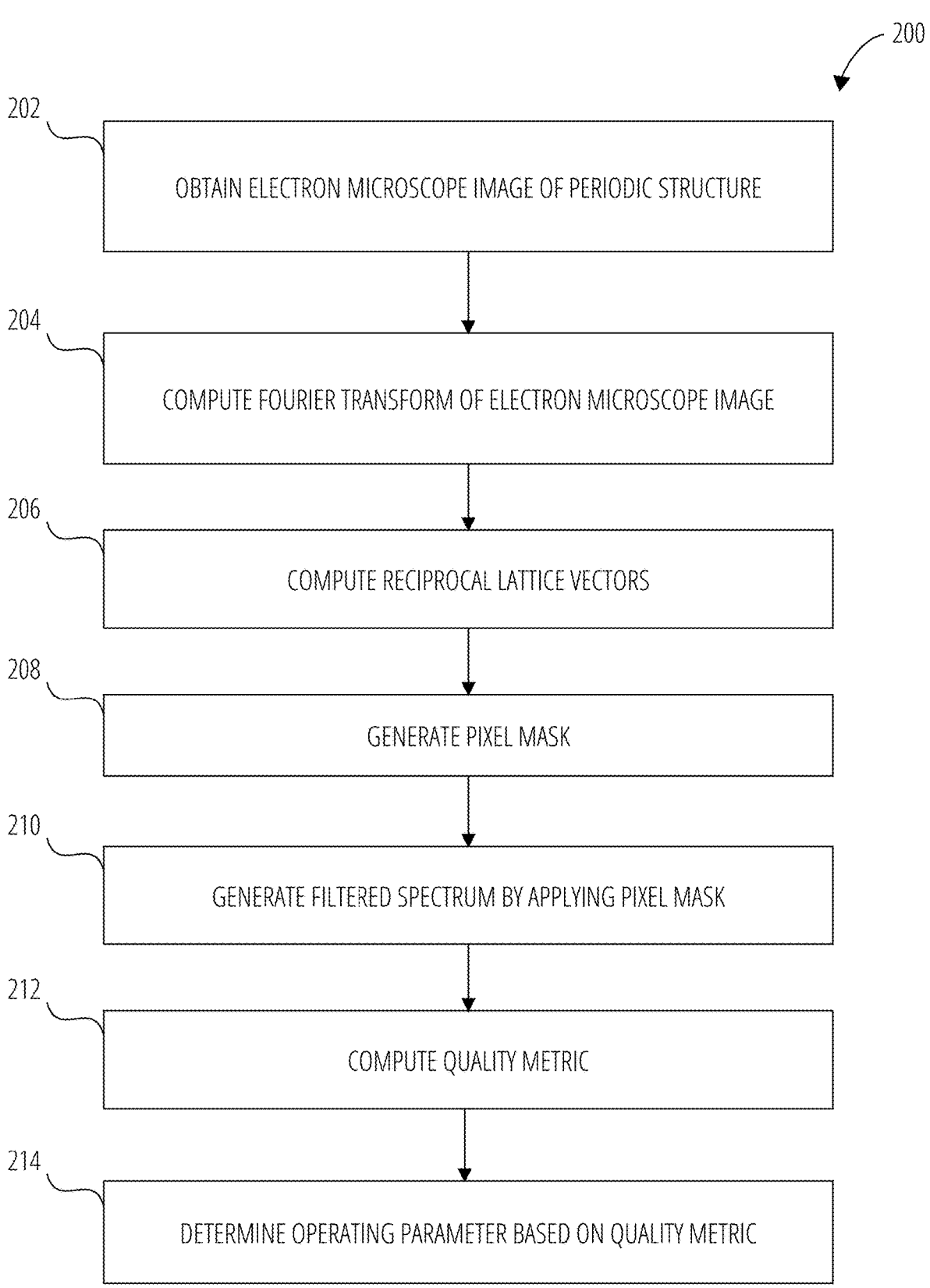
FIG. 2 illustrates a method for calibrating a SEM, in accordance with some examples.

FIG. 2 illustrates an example method 200 for calibrating a SEM for imaging of a periodic structure. Although the example method 200 depicts a particular sequence of operations, the sequence may be altered without departing from the scope of the present disclosure. For example, some of the operations depicted may be performed in parallel or in a different sequence that does not materially affect the function of the method 200. In other examples, different components of an example device or system that implements the method 200 may perform functions at substantially the same time or in a specific sequence.

The method 200 and its operations are described with reference to the SEM calibration system 100 described above. However, it will be appreciated that the operations of the method 200 may be performed by one or more devices or systems of various suitable types.

According to some examples, the method 200 includes obtaining the electron microscope image 114 of the periodic structure at operation 202. The electron microscope image 114 can be captured or generated by the SEM 102, operating according to the operating parameters 104.

According to some examples, the method 200 includes computing a Fourier transform (e.g., FFT 112) of the electron microscope image 114 at operation 204. In some examples, as described above, a windowing function can be applied to the electron microscope image 114 before computing the Fourier transform to generate the spectrum 116.

According to some examples, the method 200 includes computing the reciprocal lattice vectors based on the known periodicity 118 of the periodic structure at operation 206.

According to some examples, the method 200 includes generating the pixel mask 126, based on the periodicity 118 and reciprocal lattice vectors, at operation 208.

According to some examples, the method 200 includes generating the filtered spectrum 130 by applying the pixel mask 126 to the spectrum 116 at operation 210. A normalization operation can be performed before or after operation 210 in some examples.

According to some examples, the method 200 includes computing the quality metric 134 at operation 212. In some examples, an inverse spectrum can be generated from the filtered spectrum 130 or normalized spectrum, and the quality metric 134 is computed based on the inverse spectrum. In other examples, the quality metric 134 is computed directly from the filtered spectrum 130 or normalized spectrum.

According to some examples, the method 200 includes the optimization 136 module determining one or more of the operating parameters 104 (e.g., pixel scaling parameter 106, one or more focus parameters 108, and/or one or more stigmation parameters 110) based on the quality metric 134 at operation 214. The optimization techniques described above can be used to determine calibration values for the one or more operating parameters 104, such as iterative generation of data points of the quality metric 134 while varying the parameter being optimized, followed by fitting the data points to a Gaussian curve and computing an optimal point on the curve.

MACHINE ARCHITECTURE

Figure 3:
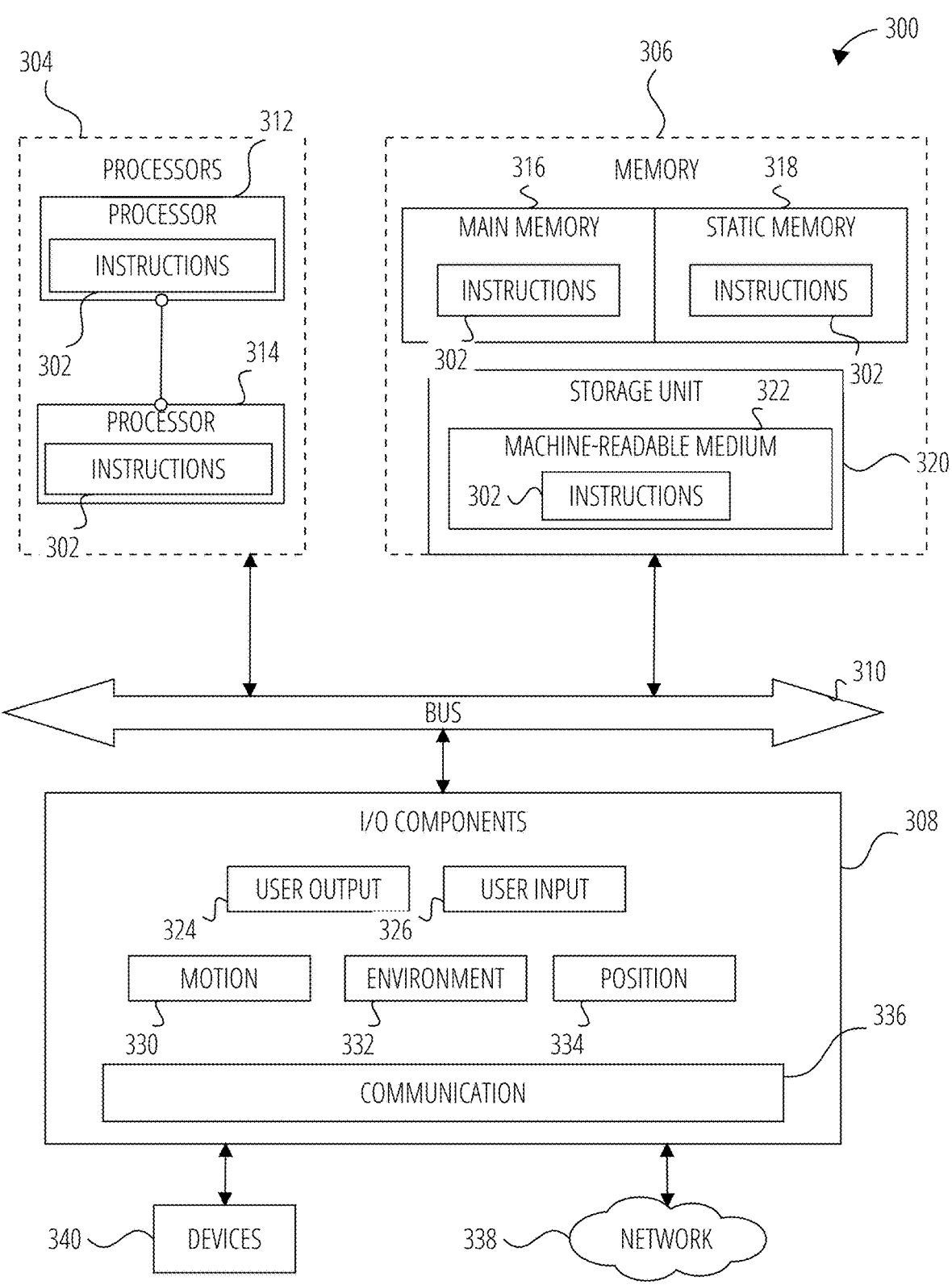
FIG. 3 is a diagrammatic representation of a machine in the form of a computer system within which a set of instructions may be executed to cause the machine to perform any one or more of the methodologies discussed herein, in accordance with some examples.

FIG. 3 is a diagrammatic representation of the machine 300 within which instructions 302 (e.g., software, a program, an application, an applet, an app, or other executable code) for causing the machine 300 to perform any one or more of the methodologies discussed herein may be executed. For example, the instructions 302 may cause the machine 300 to execute any one or more of the methods described herein, or to perform the operations of a part or a whole of any one or more of the systems described herein. The instructions 302 transform the general, non-programmed machine 300 into a particular machine 300 programmed to carry out the described and illustrated functions in the manner described. The machine 300 may operate as a standalone device or may be coupled (e.g., networked) to other machines. In a networked deployment, the machine 300 may operate in the capacity of a server machine or a client machine in a server-client network environment, or as a peer machine in a peer-to-peer (or distributed) network environment. The machine 300 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch, a pair of augmented reality glasses), a smart home device (e.g., a smart appliance), other smart devices, a web appliance, a network router, a network switch, a network bridge, or any machine capable of executing the instructions 302, sequentially or otherwise, that specify actions to be taken by the machine 300. Further, while a single machine 300 is illustrated, the term "machine" shall also be taken to include a collection of machines that individually or jointly execute the instructions 302 to perform any one or more of the methodologies discussed herein. In some examples, the machine 300 may comprise both client and server systems, with certain operations of a particular method or algorithm being performed on the server-side and with certain operations of the particular method or algorithm being performed on the client-side.

The machine 300 may include processors 304, memory 306, and input/output I/O components 308, which may be configured to communicate with each other via a bus 310. In an example, the processors 304 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 312 and a processor 314 that execute the instructions 302. The term "processor" is intended to include multi-core processors that may comprise two or more independent processors (sometimes referred to as "cores") that may execute instructions contemporaneously. Although FIG. 3 shows multiple processors 304, the machine 300 may include a single processor with a single-core, a single processor with multiple cores (e.g., a multi-core processor), multiple processors with a single core, multiple processors with multiples cores, or any combination thereof.

The memory 306 includes a main memory 316, a static memory 318, and a storage unit 320, both accessible to the processors 304 via the bus 310. The main memory 306, the static memory 318, and storage unit 320 store the instructions 302 embodying any one or more of the methodologies or functions described herein. The instructions 302 may also reside, completely or partially, within the main memory 316, within the static memory 318, within machine-readable medium 322 within the storage unit 320, within at least one of the processors 304 (e.g., within the processor's cache memory), or any suitable combination thereof, during execution thereof by the machine 300. The operating parameters 104 may also be stored in and retrieved from one or more of the memories or storage units.

The I/O components 308 may include a wide variety of components to receive input, provide output, produce output, transmit information, exchange information, capture measurements, and so on. The specific I/O components 308 that are included in a particular machine will depend on the type of machine. For example, portable machines such as mobile phones may include a touch input device or other such input mechanisms, while a headless server machine will likely not include such a touch input device. It will be appreciated that the I/O components 308 may include many other components that are not shown in FIG. 3. In various examples, the I/O components 308 may include user output components 324 and user input components 326. The user output components 324 may include visual components (e.g., a display, a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 326 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

In further examples, the I/O components 308 may include motion components 330, environmental components 332, or position components 334, among a wide array of other components. For example, the motion components 330 and/or position components 334 can include acceleration sensor components (e.g., accelerometer), gravitation sensor components, and/or rotation sensor components (e.g., gyroscope). The environmental components 332 can include sensors for sensing aspects of the environment, such as cameras or other optical, magnetic, or mechanical sensors. In some cases, these components can be used to assist in aligning samples and/or assist in adjusting the operating parameters 104.

The I/O components 308 can also include various components for sensing and/or actuating the SEM 102 and its various components, in order to implement the various operating parameters 104 described above. For example, I/O components 308 can be included for control of the stigmators, apertures, and other components of the SEM 102 to control focus and/or stigmation. In some examples, the machine 300 may be integrated with the SEM, such that the SEM forms a component of the machine 300 or the machine 300 forms part of the SEM.

Communication may be implemented using a wide variety of technologies. The I/O components 308 further include communication components 336 operable to couple the machine 300 to a network 338 or devices 340 via respective coupling or connections. For example, the communication components 336 may include a network interface component or another suitable device to interface with the network 338. In further examples, the communication components 336 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 340 may be another machine or any of a wide variety of peripheral devices (e.g., a peripheral device coupled via a USB).

Moreover, the communication components 336 may detect identifiers or include components operable to detect identifiers. For example, the communication components 336 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 336, such as location via Internet Protocol (IP) geolocation, location via Wi-Fi® signal triangulation, location via detecting an NFC beacon signal that may indicate a particular location, and so forth.

The various memories (e.g., main memory 316, static memory 318, and memory of the processors 304) and storage unit 320 may store one or more sets of instructions and data structures (e.g., software) embodying or used by any one or more of the methodologies or functions described herein. These instructions (e.g., the instructions 302), when executed by processors 304, cause various operations to implement the disclosed examples.

The instructions 302 may be transmitted or received over the network 338, using a transmission medium, via a network interface device (e.g., a network interface component included in the communication components 336) and using any one of several well-known transfer protocols (e.g., hypertext transfer protocol [HTTP]). Similarly, the instructions 302 may be transmitted or received using a transmission medium via a coupling (e.g., a peer-to-peer coupling) to the devices 340.

SOFTWARE ARCHITECTURE

Figure 4:
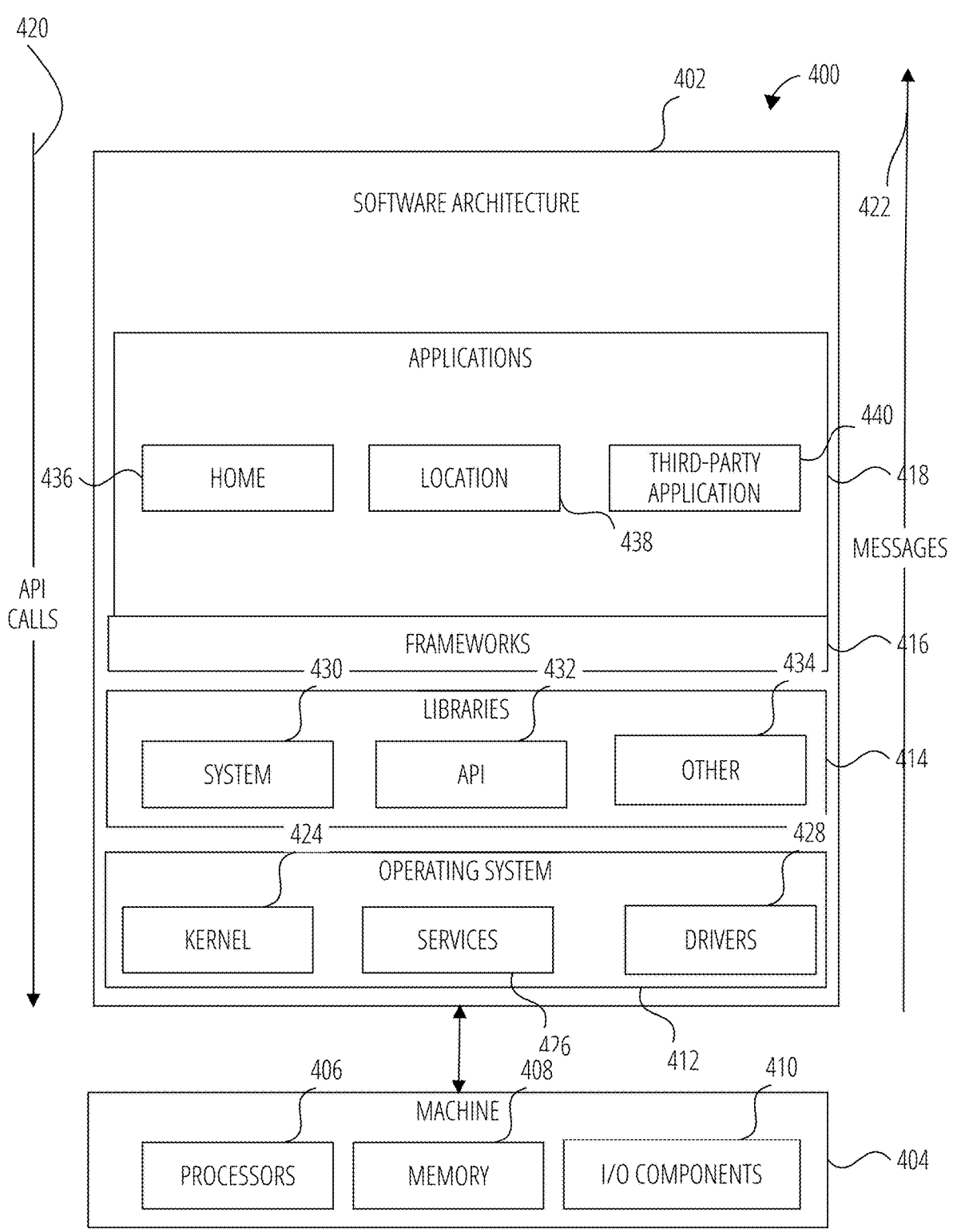
FIG. 4 is a block diagram showing a software architecture within which examples may be implemented.

FIG. 4 is a block diagram 400 illustrating a software architecture 402, which can be installed on any one or more of the devices described herein. The software architecture 402 is supported by hardware such as a machine 404 that includes processors 406, memory 408, and I/O components 410. In this example, the software architecture 402 can be conceptualized as a stack of layers, where each layer provides a particular functionality. The software architecture 402 includes layers such as an operating system 412, libraries 414, frameworks 416, and applications 418. Operationally, the applications 418 invoke API calls 420 through the software stack and receive messages 422 in response to the API calls 420. The SEM calibration system 100 may be implemented by components in one or more layers of the software architecture 402.

The operating system 412 manages hardware resources and provides common services. The operating system 412 includes, for example, a kernel 424, services 426, and drivers 428. The kernel 424 acts as an abstraction layer between the hardware and the other software layers. For example, the kernel 424 provides memory management, processor management (e.g., scheduling), component management, networking, and security settings, among other functionalities. The services 426 can provide other common services for the other software layers. The drivers 428 are responsible for controlling or interfacing with the underlying hardware. For instance, the drivers 428 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth.

The libraries 414 provide a common low-level infrastructure used by the applications 418. The libraries 414 can include system libraries 430 (e.g., C standard library) that provide functions such as memory allocation functions, string manipulation functions, mathematic functions, and the like. In addition, the libraries 414 can include API libraries 432 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 414 can also include a wide variety of other libraries 434 to provide many other APIs to the applications 418.

The frameworks 416 provide a common high-level infrastructure that is used by the applications 418. For example, the frameworks 416 provide various graphical user interface (GUI) functions, high-level resource management, and high-level location services. The frameworks 416 can provide a broad spectrum of other APIs that can be used by the applications 418, some of which may be specific to a particular operating system or platform.

In an example, the applications 418 may include a home application 436, a location application 438, and a broad assortment of other applications such as a third-party application 440. The applications 418 are programs that execute functions defined in the programs. Various programming languages can be employed to create one or more of the applications 418, structured in a variety of manners, such as object-oriented programming languages (e.g., Objective-C, Java, or C++) or procedural programming languages (e.g., C or assembly language). In some examples, the methods described herein can be implemented by one or more of the applications 418.

CONCLUSION

Examples described herein may provide techniques for the automatic calibration of the electron beam of a SEM for imaging a periodic structure.

Example 1 is a system comprising: at least one processor; and a memory storing instructions that, when executed by the at least one processor, configure the system to perform operations comprising: obtaining an electron microscope image of a periodic structure, the electron microscope image being generated by a scanning electron microscope (SEM);

computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus parameter; or a stigmation parameter.

In Example 2, the subject matter of Example 1 includes, wherein: the one or more operating parameters comprise the pixel scaling parameter, the focus parameter, and the stigmation parameter.

In Example 3, the subject matter of Example 2 includes, wherein: the determining of the pixel scaling parameter of the SEM based on the quality metric comprises: repeating, one or more times, operations comprising: varying the pixel scaling parameter; applying the pixel scaling parameter to the electron microscope image to generate a re-scaled electron microscope image; re-computing the Fourier transform of the re-scaled electron microscope image to generate a re-scaled spectrum; re-generating the filtered spectrum by applying the pixel mask to the re-scaled spectrum to generate a re-scaled filtered spectrum; and re-computing the quality metric based on the re-scaled filtered spectrum; and determining a calibrated value for the pixel scaling parameter based on the computed and re-computed values of the quality metric.

In Example 4, the subject matter of Example 3 includes, wherein: the determining of the focus parameter and stigmation parameter of the SEM based on the quality metric comprises: generating a plurality of values for the quality metric by repeating, one or more times, operations comprising: varying at least one of the focus parameter or the stigmation parameter; applying the focus parameter and the stigmation parameter to the SEM; and the operations of obtaining the electron microscope image of the periodic structure using the SEM, computing the Fourier transform, generating the filtered spectrum, and computing the quality metric; and determining calibrated values for the focus parameter and stigmation parameter based on the plurality of values of the quality metric.

In Example 5, the subject matter of Example 4 includes, wherein: the determining of the calibrated values for the focus parameter and stigmation parameter based on the plurality of values of the quality metric comprises: fitting a Gaussian curve to the plurality of values of the quality metric relative to the focus parameter or the stigmation parameter; and determining the calibrated values for the focus parameter or stigmation parameter based on an optimum value of the quality metric on the Gaussian curve.

In Example 6, the subject matter of Examples 4-5 includes, wherein: the determining of the pixel scaling parameter of the SEM is performed on a reference sample of the periodic structure; and the determining of the focus parameter and stigmation parameter of the SEM is performed for each of a plurality of test samples of the periodic structure.

In Example 7, the subject matter of Example 6 includes, wherein the operations further comprise: imaging each test sample with the SEM one or more times using the calibrated values for the pixel scaling parameter, the focus parameter, and the stigmation parameter; and re-determining the focus parameter and the stigmation parameter after each M images, M being a positive integer greater than one.

In Example 8, the subject matter of Example 7 includes, wherein the operations further comprise: re-determining the pixel scaling parameter after each N images, N being a positive integer greater than M.

In Example 9, the subject matter of Examples 1-8 includes, wherein: the generating of the filtered spectrum by applying the pixel mask to the spectrum comprises: tiling the pixel mask across the spectrum based on the reciprocal lattice vectors, thereby generating a tiled mask; and filtering the spectrum using the tiled mask to generate the filtered spectrum.

In Example 10, the subject matter of Examples 1-9 includes, wherein: the computing of the quality metric comprises: normalizing the filtered spectrum by dividing a magnitude of one or more components of the filtered spectrum by the magnitude of the zero-frequency component of the filtered spectrum, thereby generating a normalized spectrum; performing an inverse Fourier transform of the normalized spectrum to generate an inverse spectrum; and summing absolute values of one or more components of the inverse spectrum.

In Example 11, the subject matter of Examples 1-10 includes, wherein the operations further comprise: applying a windowing function to the electron microscope image, the windowing function being configured to mitigate edge effects when generating the spectrum.

Example 12 is a method, performed by at least one processor, comprising: obtaining an electron microscope image of a periodic structure, the electron microscope image being generated by a scanning electron microscope (SEM); computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus parameter; or a stigmation parameter.

In Example 13, the subject matter of Example 12 includes, wherein: the one or more operating parameters comprise the pixel scaling parameter, the focus parameter, and the stigmation parameter.

In Example 14, the subject matter of Example 13 includes, wherein: the determining of the pixel scaling parameter of the SEM based on the quality metric comprises: repeating, one or more times, operations comprising: varying the pixel scaling parameter; applying the pixel scaling parameter to the electron microscope image to generate a re-scaled electron microscope image; re-computing the Fourier transform of the re-scaled electron microscope image to generate a re-scaled spectrum; re-generating the filtered spectrum by applying the pixel mask to the re-scaled spectrum to generate a re-scaled filtered spectrum; and re-computing the quality metric based on the re-scaled filtered spectrum; and determining a calibrated value for the pixel scaling parameter based on the computed and re-computed values of the quality metric.

In Example 15, the subject matter of Example 14 includes, wherein: the determining of the focus parameter and stigmation parameter of the SEM based on the quality metric comprises: generating a plurality of values for the quality metric by repeating, one or more times, operations comprising: varying at least one of the focus parameter or the stigmation parameter; applying the focus parameter and the stigmation parameter to the SEM; and the operations of obtaining the electron microscope image of the periodic structure using the SEM, computing the Fourier transform, generating the filtered spectrum, and computing the quality metric; and determining calibrated values for the focus parameter and stigmation parameter based on the plurality of values of the quality metric.

In Example 16, the subject matter of Examples 12-15 includes, wherein: the generating of the filtered spectrum by applying the pixel mask to the spectrum comprises: tiling the pixel mask across the spectrum based on the reciprocal lattice vectors, thereby generating a tiled mask; and filtering the spectrum using the tiled mask to generate the filtered spectrum.

In Example 17, the subject matter of Examples 12-16 includes, wherein: the computing of the quality metric comprises: normalizing the filtered spectrum by dividing a magnitude of one or more components of the filtered spectrum by the magnitude of the zero-frequency component of the filtered spectrum, thereby generating a normalized spectrum; performing an inverse Fourier transform of the normalized spectrum to generate an inverse spectrum; and summing absolute values of one or more components of the inverse spectrum.

In Example 18, the subject matter of Examples 12-17 includes, applying a windowing function to the electron microscope image, the windowing function being configured to mitigate edge effects when generating the spectrum.

Example 19 is a non-transitory computer-readable storage medium, the computer-readable storage medium including instructions that when executed by at least one processor of a system, cause the system to perform operations comprising: obtaining an electron microscope image of a periodic structure, the electron microscope image being generated by a scanning electron microscope (SEM); computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus parameter; or a stigmation parameter.

Example 20 is a kit comprising: the non-transitory computer-readable storage medium of Example 19; and a reference sample of the periodic structure.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

GLOSSARY

"Client device" refers, for example, to any machine that interfaces to a communications network to obtain resources from one or more server systems or other client devices. A client device may be, but is not limited to, a mobile phone, desktop computer, laptop, portable digital assistants (PDAs), smartphones, tablets, ultrabooks, netbooks, laptops, multi-processor systems, microprocessor-based or programmable consumer electronics, game consoles, set-top boxes, or any other communication device that a user may use to access a network.

"Communication network" refers, for example, to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network, and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth-generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"User device" refers, for example, to a device accessed, controlled or owned by a user and with which the user interacts perform an action, or an interaction with other users or computer systems.

What is claimed is:

1. A system comprising: at least one processor; and a memory storing instructions that, when executed by the at least one processor, configure the system to perform operations comprising: obtaining an electron microscope image of a periodic structure, the electron microscope image being generated by a scanning electron microscope (SEM); computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus para meter; or a stigmation parameter.

2. The system of claim 1, wherein: the one or more operating parameters comprise the pixel scaling parameter, the focus parameter, and the stigmation parameter.

3. The system of claim 2, wherein: the determining of the pixel scaling parameter of the SEM based on the quality metric comprises: repeating, one or more times, operations comprising: varying the pixel scaling parameter; applying the pixel scaling parameter to the electron microscope image to generate a re-scaled electron microscope image; re-computing the Fourier transform of the re-scaled electron microscope image to generate a re-scaled spectrum; re-generating the filtered spectrum by applying the pixel mask to the re-scaled spectrum to generate a re-scaled filtered spectrum; and re-computing the quality metric based on the re-scaled filtered spectrum; and determining a calibrated value for the pixel scaling parameter based on the computed and re-computed values of the quality metric.

4. The system of claim 3, wherein: the determining of the focus parameter and stigmation parameter of the SEM based on the quality metric comprises: generating a plurality of values for the quality metric by repeating, one or more times, operations comprising: varying at least one of the focus parameter or the stigmation parameter; applying the focus parameter and the stigmation parameter to the SEM; and the operations of obtaining the electron microscope image of the periodic structure using the SEM, computing the Fourier transform, generating the filtered spectrum, and computing the quality metric; and determining calibrated values for the focus parameter and stigmation parameter based on the plurality of values of the quality metric.

5. The system of claim 4, wherein: the determining of the calibrated values for the focus parameter and stigmation parameter based on the plurality of values of the quality metric comprises: fitting a Gaussian curve to the plurality of values of the quality metric relative to the focus parameter or the stigmation parameter; and determining the calibrated values for the focus parameter or stigmation parameter based on an optimum value of the quality metric on the Gaussian curve.

6. The system of claim 4, wherein: the determining of the pixel scaling parameter of the SEM is performed on a reference sample of the periodic structure; and the determining of the focus parameter and stigmation parameter of the SEM is performed for each of a plurality of test samples of the periodic structure.

7. The system of claim 6, wherein the operations further comprise: imaging each test sample with the SEM one or more times using the calibrated values for the pixel scaling parameter, the focus parameter, and the stigmation parameter; and re-determining the focus parameter and the stigmation parameter after each M images, M being a positive integer greater than one.

8. The system of claim 7, wherein the operations further comprise: re-determining the pixel scaling parameter after each N images, N being a positive integer greater than M.

9. The system of claim 1, wherein: the generating of the filtered spectrum by applying the pixel mask to the spectrum comprises: tiling the pixel mask across the spectrum based on the reciprocal lattice vectors, thereby generating a tiled mask; and filtering the spectrum using the tiled mask to generate the filtered spectrum.

10. The system of claim 1, wherein: the computing of the quality metric comprises: normalizing the filtered spectrum by dividing a magnitude of one or more components of the filtered spectrum by the magnitude of the zero-frequency component of the filtered spectrum, thereby generating a normalized spectrum; performing an inverse Fourier transform of the normalized spectrum to generate an inverse spectrum; and summing absolute values of one or more components of the inverse spectrum.

11. The system of claim 1, wherein the operations further comprise: applying a windowing function to the electron microscope image, the windowing function being configured to mitigate edge effects when generating the spectrum.

12. A method, performed by at least one processor, comprising: obtaining an electron microscope image of a periodic structure, the electron microscope image being generated by a scanning electron microscope (SEM); computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus parameter; or a stigmation parameter.

13. The method of claim 12, wherein: the one or more operating parameters comprise the pixel scaling parameter, the focus parameter, and the stigmation parameter.

14. The method of claim 13, wherein: the determining of the pixel scaling parameter of the SEM based on the quality metric comprises: repeating, one or more times, operations comprising: varying the pixel scaling parameter; applying the pixel scaling parameter to the electron microscope image to generate a re-scaled electron microscope image; re-computing the Fourier transform of the re-scaled electron microscope image to generate a re-scaled spectrum; re-generating the filtered spectrum by applying the pixel mask to the re-scaled spectrum to generate a re-scaled filtered spectrum; and re-computing the quality metric based on the re-scaled filtered spectrum; and determining a calibrated value for the pixel scaling parameter based on the computed and re-computed values of the quality metric.

15. The method of claim 14, wherein: the determining of the focus parameter and stigmation parameter of the SEM based on the quality metric comprises: generating a plurality of values for the quality metric by repeating, one or more times, operations comprising: varying at least one of the focus parameter or the stigmation parameter; applying the focus parameter and the stigmation parameter to the SEM; and the operations of obtaining the electron microscope image of the periodic structure using the SEM, computing the Fourier transform, generating the filtered spectrum, and computing the quality metric; and determining calibrated values for the focus parameter and stigmation parameter based on the plurality of values of the quality metric.

16. The method of claim 12, wherein: the generating of the filtered spectrum by applying the pixel mask to the spectrum comprises: tiling the pixel mask across the spectrum based on the reciprocal lattice vectors, thereby generating a tiled mask; and filtering the spectrum using the tiled mask to generate the filtered spectrum.

17. The method of claim 12, wherein: the computing of the quality metric comprises: normalizing the filtered spectrum by dividing a magnitude of one or more components of the filtered spectrum by the magnitude of the zero-frequency component of the filtered spectrum, thereby generating a normalized spectrum; performing an inverse Fourier transform of the normalized spectrum to generate an inverse spectrum; and summing absolute values of one or more components of the inverse spectrum.

18. The method of claim 12, further comprising: applying a windowing function to the electron microscope image, the windowing function being configured to mitigate edge effects when generating the spectrum.

19. A non-transitory computer-readable storage medium, the computer-readable storage medium including instructions that when executed by at least one processor of a system, cause the system to perform operations comprising: obtaining an electron microscope image of a periodic structure, the electron microscope image being generated by a scanning electron microscope (SEM); computing a Fourier transform of the electron microscope image to generate a spectrum; computing reciprocal lattice vectors based on a known periodicity of the periodic structure; generating a pixel mask based on the reciprocal lattice vectors; generating a filtered spectrum by applying the pixel mask to the spectrum; computing a quality metric based on: an aggregate magnitude of components of the filtered spectrum; and a magnitude of a zero-frequency component of the filtered spectrum; and determining one or more operating parameters of the SEM based on the quality metric, the one or more operating parameters comprising at least one of: a pixel scaling parameter; a focus parameter; or a stigmation parameter.

20. A kit comprising: the non-transitory computer-readable storage medium of claim 19; and a reference sample of the periodic structure.

* * * * *